(12) United States Patent
Park

(10) Patent No.: US 9,136,501 B2
(45) Date of Patent: Sep. 15, 2015

(54) ORGANIC LIGHT-EMITTING DISPLAY APPARATUS AND METHOD OF MANUFACTURING THE SAME

(75) Inventor: Soon-Ryong Park, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/539,020

(22) Filed: Jun. 29, 2012

(65) Prior Publication Data

US 2013/0168644 A1 Jul. 4, 2013

(30) Foreign Application Priority Data

Dec. 28, 2011 (KR) .......................... 10-2011-0144980

(51) Int. Cl.
*H01L 51/52* (2006.01)
*H01L 51/56* (2006.01)
*H01L 27/32* (2006.01)

(52) U.S. Cl.
CPC ........ H01L 51/5234 (2013.01); H01L 51/5256 (2013.01); H01L 51/5268 (2013.01); *H01L 27/3244* (2013.01); *H01L 51/5281* (2013.01); *H01L 2251/5315* (2013.01)

(58) Field of Classification Search
CPC .................................................. H01L 51/5256
USPC ......................................................... 257/40
See application file for complete search history.

(56) References Cited

U.S. PATENT DOCUMENTS

| | | | | |
|---|---|---|---|---|
| 5,955,837 | A * | 9/1999 | Horikx et al. ................. | 313/506 |
| 7,902,748 | B2 * | 3/2011 | Cok .............................. | 313/506 |
| 7,982,396 | B2 | 7/2011 | Cok | |
| 8,018,145 | B2 * | 9/2011 | Hosoda et al. ................. | 313/504 |
| 8,022,437 | B2 * | 9/2011 | Koyama ......................... | 257/100 |
| 2007/0126353 | A1 * | 6/2007 | Kubota et al. ................. | 313/506 |
| 2008/0012477 | A1 | 1/2008 | Koo et al. | |
| 2009/0230841 | A1 | 9/2009 | Boerner | |
| 2010/0012961 | A1 * | 1/2010 | Tobise ............................ | 257/98 |
| 2010/0155757 | A1 * | 6/2010 | Kim et al. ...................... | 257/98 |
| 2010/0156765 | A1 * | 6/2010 | Park et al. ....................... | 345/77 |
| 2010/0194717 | A1 * | 8/2010 | Mori et al. ..................... | 345/204 |
| 2010/0200846 | A1 | 8/2010 | Kwack et al. | |
| 2011/0121271 | A1 * | 5/2011 | Jeon et al. ....................... | 257/40 |
| 2011/0147721 | A1 | 6/2011 | Han | |

FOREIGN PATENT DOCUMENTS

| | | |
|---|---|---|
| KR | 10-2008-0006304 | 1/2008 |
| KR | 10-2010-0090888 | 8/2010 |
| KR | 10-2011-0071530 | 6/2011 |

* cited by examiner

*Primary Examiner* — Caleb Henry
*Assistant Examiner* — Mounir Amer
(74) *Attorney, Agent, or Firm* — Robert E. Bushnell, Esq.

(57) ABSTRACT

An organic light-emitting display apparatus includes a substrate, a pixel electrode disposed on the substrate, an opposing electrode disposed on the pixel electrode and transmitting light therethrough, an organic light-emitting layer disposed between the pixel electrode and the opposing electrode and emitting light toward at least the opposing electrode, a first transmission layer disposed on the opposing electrode and transmitting the light emitted from the organic light-emitting layer therethrough, and a second transmission layer disposed on a path of the light emitted from the organic light-emitting layer on the first transmission layer, and comprising a plurality of first materials having first refractive indices and a second material having a second refractive index. The first refractive indices are greater than the second refractive index, and the plurality of first materials are disposed inside the second material.

10 Claims, 5 Drawing Sheets

ORGANIC LIGHT-EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 28 of Dec. 2011 and there duly assigned Serial No. 10-2011-0144980.

BACKGROUND OF THE INVENTION

1. Field of the Invention

The present invention relates to an organic light-emitting display apparatus and a method of manufacturing the same.

2. Description of the Related Art

Organic light-emitting display apparatuses are self-emitting display apparatuses that include organic light emitting devices including hole injection electrodes, electron injection electrodes, and organic light emitting layers disposed therebetween, and that emit light when excitons formed by combining holes of hole injection electrodes and electrons of electrons injection electrodes change from an excitation state to a ground state.

Organic light-emitting display apparatuses that are self-emitting display apparatuses do not need additional light sources, and thus they are attracting attention as next generation display apparatuses since they may be driven at a low voltage, are lightweight and thin, and have wide viewing angles, high contrast, and a quick response speed.

However, organic light-emitting display apparatuses deteriorate due to external moisture or oxygen, and thus organic light-emitting devices are encapsulated to protect them from external moisture or oxygen.

Recently, to achieve thin and/or flexible organic light-emitting display apparatuses, a thin film encapsulation (TFE) consisting of a plurality of layers, including a plurality of inorganic films or inorganic films and inorganic films, is used to encapsulate organic light-emitting devices.

However, a color shift occurs at lateral viewing angles of organic light-emitting display apparatuses due to a difference in paths of light externally emitted through the TFE.

SUMMARY OF THE INVENTION

The present invention provides an organic light-emitting display apparatus that reduces a color shift occurring at lateral viewing angles thereof, and a method of manufacturing the organic light-emitting display apparatus.

According to an aspect of the present invention, there is provided an organic light-emitting display apparatus including: a substrate; a pixel electrode disposed on the substrate; an opposing electrode disposed on the pixel electrode and transmitting light therethrough; an organic light-emitting layer disposed between the pixel electrode and the opposing electrode and emitting light toward at least the opposing electrode; a first transmission layer disposed on the opposing electrode and transmitting the light emitted from the organic light-emitting layer therethrough; and a second transmission layer disposed on a path of the light emitted from the organic light-emitting layer on the first transmission layer, and comprising a plurality of first materials having first refractive indices and a second material having a second refractive index, wherein the first refractive indices are greater than the second refractive index, and the plurality of first materials are disposed inside the second material.

The organic light-emitting display apparatus may further include an optical member disposed on the second transmission layer.

The second material may comprise a viscous material.

The second transmission layer may comprise a first layer contacting the first transmission layer and comprising the viscous material, a second layer disposed on the first layer and comprising the plurality of first materials and the second material, and a third layer disposed on the second layer and comprising the viscous material.

The organic light-emitting display apparatus may further include a protection layer disposed between the opposing electrode and the first transmission layer.

The first refractive indices of the plurality of first materials may be 1.5 or more.

Sizes of the plurality of first materials may be between 0.1 μm and 5 μm.

The plurality of first materials may comprise zirconium (Zr) or silicon (Si).

A distance between the organic light-emitting layer and the second transmission layer may be 50 μm or less.

The substrate may be a flexible substrate.

The first transmission layer may comprise a plurality of layers in which inorganic films and organic films are alternately disposed.

According to another aspect of the present invention, there is provided a method of manufacturing an organic light-emitting display apparatus, the method including: (a) sequentially forming a pixel electrode, an organic light-emitting layer, and an opposing electrode transmitting light therethrough on a substrate; (b) forming a first transmission layer on the opposing electrode to transmit light emitted from the an organic light-emitting layer therethrough; and (c) forming a second transmission layer on a path of the light emitted from the organic light-emitting layer on the first transmission layer, and comprising a plurality of first materials having first refractive indices and a second material having a second refractive index, wherein the first refractive indices are greater than the second refractive index, and the plurality of first materials are disposed inside the second material.

The method of manufacturing an organic light-emitting display apparatus may further include forming an optical member on the second transmission layer after operation (c).

In operation (c), the second material may comprise a viscous material.

The operation (c) may comprise: forming a first layer contacting the first transmission layer and comprising the viscous material; forming a second layer on the first layer and comprising the plurality of first materials and the second material; and forming a third layer on the second layer and comprising the viscous material.

The method of manufacturing an organic light-emitting display apparatus may further include forming a protection layer between the operations (a) and (b).

In operation (c), the first refractive indices of the plurality of first materials may be 1.5 or more.

In operation (c), sizes of the plurality of first materials may be between 0.1 μm and 5 μm.

In operation (c), the plurality of first materials may comprise zirconium (Zr) or silicon (Si).

A distance between the organic light-emitting layer and the second transmission layer may be 50 μm or less.

The substrate may be a flexible substrate.

In operation (b), forming the first transmission layer may comprise forming a plurality of layers in which inorganic films and organic films are alternately disposed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

An exemplary embodiment according to the present invention will now be described in detail with reference to the accompanying drawings. As used herein, the term "and/or" includes any and all combinations of one or more of the associated listed items. Expressions such as "at least one of," when preceding a list of elements, modify the entire list of elements and do not modify the individual elements of the list.

Figure 1:
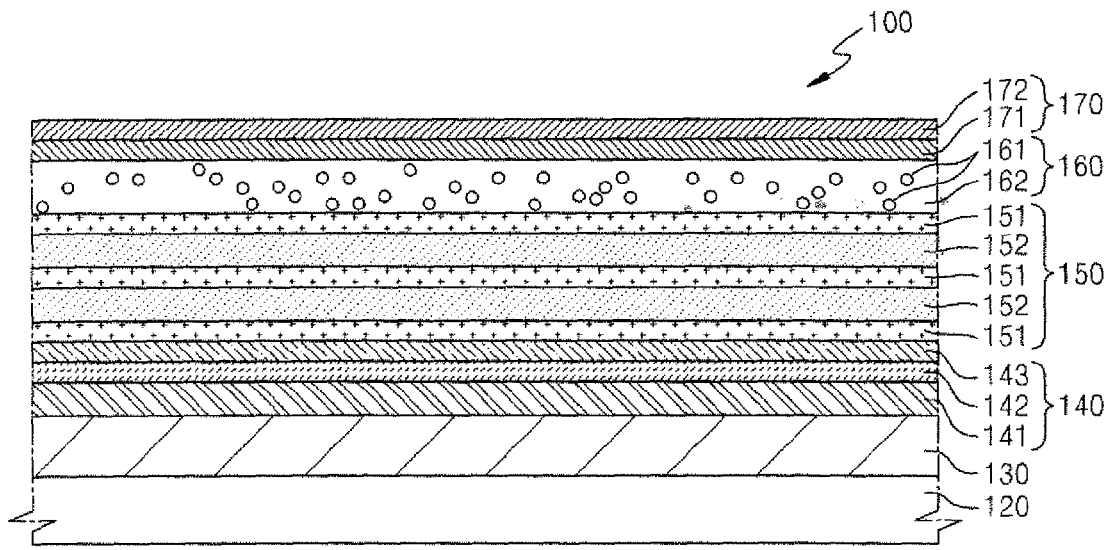
FIG. 1 is a schematic cross-sectional view of an organic light-emitting display apparatus according to an embodiment of the present invention.
Figure 2:
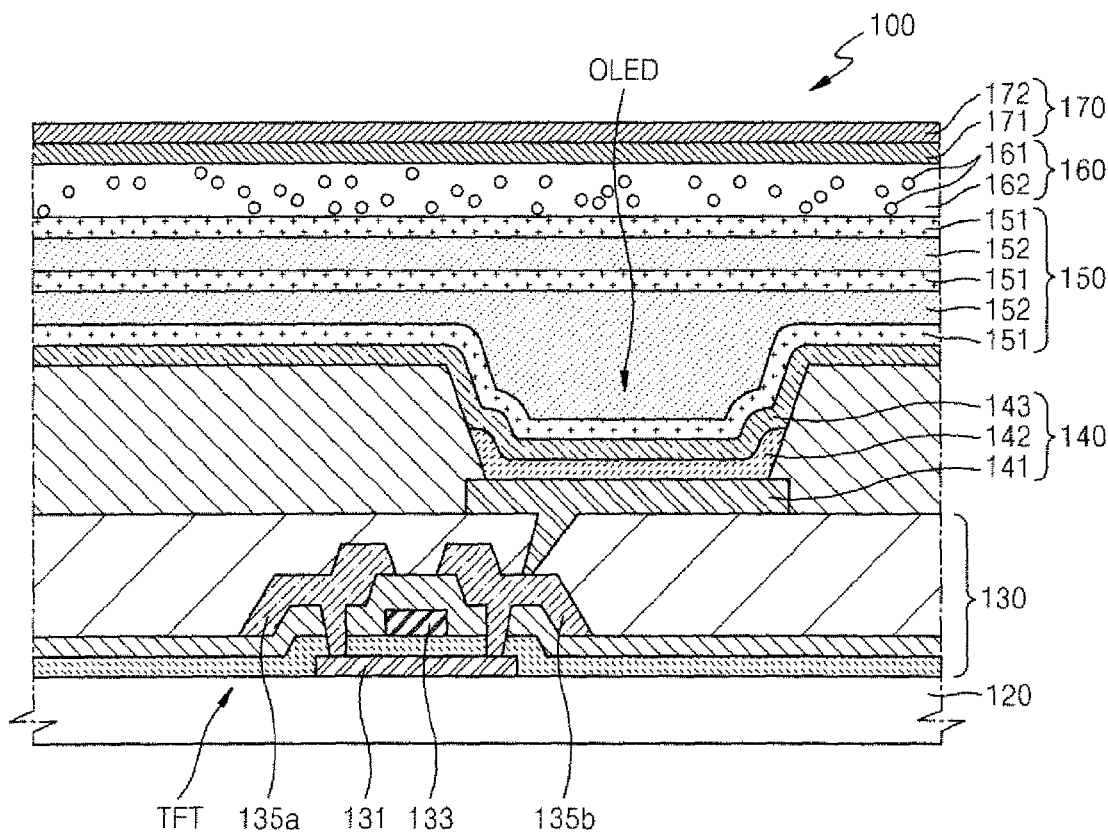
FIG. 2 is a schematic cross-sectional view of a pixel region of the organic light-emitting display apparatus of FIG. 1.

FIG. 1 is a schematic cross-sectional view of an organic light-emitting display apparatus 100 according to an embodiment of the present invention. FIG. 2 is a schematic cross-sectional view of a pixel region of the organic light-emitting display apparatus 100 of FIG. 1.

Referring to FIGS. 1 and 2, the organic light-emitting display apparatus 100 of the present embodiment includes a substrate 120, a pixel electrode 141 disposed on the substrate 120, an opposing electrode 143 disposed on the pixel electrode 141 and transmitting light therethrough, an organic light-emitting device (OLED) 140 disposed between the pixel electrode 141 and the opposing electrode 143 and emitting light toward the opposing electrode 143, a first transmission layer 150 disposed on the opposing electrode 143 and transmitting light emitted from an organic light-emitting layer 142 therethrough, and a second transmission layer 160 disposed on a path of the light emitted from the organic light-emitting layer 142 on the first transmission layer 150, and including a plurality of first materials 161 having first refractive indices and a second material 162 having a second refractive index, in which the first refractive indices are greater than the second refractive index, and the first materials 161 are disposed inside the second material 162.

The substrate 120 may be a flexible substrate, and may be formed of plastic having excellent heat resistance and durability such as polyethyleneetherphthalate, polyethylenenaphthalate, polycarbonate, polyarylate, polyetherimide, polyethersulfone, and polyimide, etc. However, the present invention is not limited thereto, and the substrate 120 may be formed of various materials such as metal or glass.

A device/wiring layer 130 may be disposed on the substrate 120, and may include a driving thin film transistor (TFT) for driving the OLED 140, a switching TFT (not shown), a capacitor, and wiring connected to the TFTs or the capacitor.

The driving TFT includes an active layer 131, a gate electrode 133, and source and drain electrodes 135a and 135b, respectively.

A barrier film (not shown) may be further disposed between the substrate 120 and the device/wiring layer 130 to prevent external impurities, such as moisture or oxygen, from transmitting through the substrate 120 and penetrating into the OLED 140.

The OLED 140 is disposed on the device/wiring layer 130. The OLED 140 includes the pixel electrode 141, the organic light-emitting layer 142 disposed on the pixel electrode 141, and the opposing electrode 143 formed on the organic light-emitting layer 142.

In the present embodiment, the pixel electrode 141 is an anode, and the opposing electrode 143 is a cathode. However, the present invention is not limited thereto, and the pixel electrode 141 may be the cathode, and the opposing electrode 143 may be the anode according to a method of driving the organic light-emitting display apparatus 100. Holes and electrons are respectively injected into the organic light-emitting layer 142 from the pixel electrode 141 and the opposing electrode 143. Excitons combined with the injected holes and electrons change from an excitation state to a ground state, and thus the organic light-emitting layer 142 emits light.

The pixel electrode 141 is electrically connected to the driving TFT formed in the device/wiring layer 130.

Although the OLED 140 is disposed on the device/wiring layer 130 including the driving TFT in the present embodiment, the present invention is not limited thereto. The structure of the OLED 140 may be modified in various ways. For example, the pixel electrode 141 of the OLED 140 may be formed in the same layer as the active layer 131 of the TFT, as the gate electrode 133 thereof, or as the source and drain electrodes 135a and 135b, respectively, thereof.

Although the gate electrode 133 is disposed on the active layer 131 in the driving TFT of the present embodiment, the present invention is not limited thereto. The gate electrode 133 may be disposed below the active layer 131.

The pixel electrode 141 included in the OLED 140 of the present embodiment may be a reflective electrode, and may include a reflective film formed of Ag, Mg, Al, Pt, Pd, Au, Ni, Nd, Ir, and Cr, and a transparent or semi-transparent electrode layer formed on the reflective film.

The transparent or semi-transparent electrode layer may be formed of at least one of indium tin oxide (ITO), indium zinc oxide (IZO), zinc oxide (ZnO), indium oxide ($In_2O_3$), indium gallium oxide (IGO), and aluminum zinc oxide (AZO).

The opposing electrode 143 disposed to oppose to the pixel electrode 141 may be a transparent or semi-transparent electrode, and may include a metal thin film having a small work function formed of Li, Ca, LiF/Ca, LiF/Al, Al, Ag, Mg, and compounds of these. An auxiliary electrode layer or a bus electrode may be further formed on the metal thin film using a material for forming a transparent electrode such as ITO, IZO, ZnO, or $In_2O_3$.

Thus, the opposing electrode 143 may transmit light emitted from the organic light-emitting layer 142 therethrough.

The organic light-emitting layer 142 is disposed between the pixel electrode 141 and the opposing electrode 143, and may be a low molecular weight organic material or a high molecular weight organic material.

In addition to the organic light-emitting layer 142, an intermediate layer such as a hole transport layer (HTL), a hole injection layer (HIL), an electron transport layer (ETL), and an electron injection layer (EIL) may be selectively disposed between the pixel electrode 141 and the opposing electrode 143.

The light emitted from the organic light-emitting layer 142 may be a front light-emitting type that is emitted toward the opposing electrode 143 directly or after being reflected from the pixel electrode 141 including the reflective electrode.

The first transmission layer 150 is disposed on the opposing electrode 143, and may include a plurality of layers in which inorganic films 151 and organic films 152 are alternately disposed.

In the present embodiment, the substrate 120 is a flexible substrate, and the first transmission layer 150 is a thin film including the inorganic films 151 and the organic films 152, and thus the flexible and thin organic light-emitting display apparatus 100 is easily achieved. Also, the first transmission layer 150 is disposed to directly cover the OLED 140 so that the OLED 140 is encapsulated and protected from the outside. In this regard, although a layer like a protection layer (not shown) may be further disposed between the first transmission layer 150 and the OLED 140, a charging material required by an encapsulation means due to a glass substrate is not needed.

The inorganic films 151 may be formed of a metal oxide, a metal nitride, a metal carbide, and a compound of these, for example, an aluminum oxide, a silicon oxide, or a silicon nitride. The inorganic films 151 serve to suppress external moisture and/or oxygen from penetrating into the OLED 140.

The organic films 152 may include one of epoxy, acrylate, and urethaneacrylate, and may be monomers so as to achieve the thin organic light-emitting display apparatus 100. The organic films 152 serve as relaxing inner stress of the inorganic films 151 or as supplementing and planarizing defects of the inorganic films 151.

In this regard, the inorganic films 151 may be disposed in the outermost side of the first transmission layer 150 so as to effectively block external moisture and/or oxygen from penetrating into the OLED 140.

Although the inorganic films 151 are stacked as three layers, and the organic films 152 are stacked as two layers in the present embodiment, the present invention is not limited thereto. That is, there is no limitation to the layers of the inorganic films 151 and the organic films 152 that are alternately stacked.

The second transmission layer 160, including a plurality of first materials 161 and a second material 162, is disposed on the first transmission layer 150. The first materials 161 have first refractive indices. The second material 162 has a second refractive index. The first refractive index has a value greater than that of the second refractive index.

The second material 162 may be resin generally having a refractive index of 1.5 or less. For example, the second material 162 may be acrylic resin having a refractive index of approximately 1.49.

In this regard, since the first refractive indices of the first materials 161 need to be greater than the second refractive index in order to effectively scatter light incident to the second transmission layer 160 by using the first materials 161, the first refractive indices of the first materials 161 may be 1.5 or more. If the second material 162 is highly refractive resin, the first refractive indices of the first material 161 may be 2.0 or more.

The plurality of first materials 161 are disposed inside the second material 162, and may be spherical. The first materials 161 may include zirconium (Zr) or silicon (Si), and may have diameters between 0.1 μm and 5 μm.

The second material 162 may include a viscous material. The viscous material may be transparent polymer such as acrylic polymer, silicon-based polymer, polyester, polyurethane, polyamide, polyether, fluorine- or rubber-based polymer.

The first transmission layer 150 may be formed as a thin film encapsulation (TFE). In this regard, a distance between the organic light-emitting layer 142 disposed in a lower portion of the first transmission layer 150 and the second transmission layer 160 disposed in an upper portion of the first transmission layer 150 may be 50 μm or less. If the distance between the organic light-emitting layer 142 and the second transmission layer 160 exceeds 50 μm, a screen of the organic light-emitting display apparatus 100 looks blurry, which deteriorates quality of an image. This will be described later.

The light emitted from the organic light-emitting layer 142 is incident onto the second transmission layer 160 including the first materials 161 and the second material 162 directly or after being reflected from the pixel electrode 141. In this regard, a direction to which the light incident to the second transmission layer 160 travels is changed due to the first materials 161 having the first refractive indices greater than that of the second material 162 and sizes of 5 μm or less, and thus the light is externally emitted having various angles.

The light emitted from the organic light-emitting layer 142 has no directivity, and travels in different light paths. Thus, although light having desired color purity is emitted in the front of the organic light-emitting display apparatus 100, a color shift occurs at lateral viewing angles thereof.

However, the light traveling in different light paths is incident onto the second transmission layer 160, and the light incident onto the second transmission layer 160 is externally emitted having different angles in the present embodiment, and thus the light traveling in different light paths is mixed in the front and side of the organic light-emitting display apparatus 100.

Thus, a difference in color coordinates in the front and sides of the organic light-emitting display apparatus 100, i.e. the color shift at lateral viewing angles thereof, may be reduced.

Furthermore, the inorganic films 151 may be disposed on the outermost layer of the first transmission layer 150 contacting the second transmission layer 160 in order to effectively block external moisture and/or oxygen from penetrating into the OLED 140. In this case, refractive indices of the inorganic films 151 may be greater than the second refractive index of the second material 162 included in the second transmission layer 160.

In this case, if an incident angle of light incident onto the second transmission layer 160 is greater than a predetermined angle, the light is totally reflected, which may reduce efficiency of extracted light. However, since the first materials 161 having the first refractive indices greater than the second refractive index of the second material 162 are included in the second material 162 in the second transmission layer 160 of the present embodiment, a probability that the light is totally reflected and is not externally emitted is reduced, thereby increasing light efficiency.

An optical member 170 may be disposed on the second transmission layer 160. The optical member 170 may include a phase delay plate 171 and a polarizing plate 172. The phase delay plate 171 may be a ¼ wavelength plate (λ/4 plate).

The optical member 170 of the present embodiment serves to suppress external light from being reflected, and to enhance visibility and contrast of the organic light-emitting display apparatus 100.

Tables 1 to 4 below show Haze values of the second transmission layer 160, i.e. brightness ratios of portions of the first materials 161 included in the second material 162 and variations of color coordinate values with respect to y and x axes, in white W, red R, green G, and blue B of the organic light-emitting display apparatus 100.

Brightness ratios are values by percentage of ratios of brightness values of light emitted toward the front of the organic light-emitting display apparatus 100 and brightness values of light emitted and inclined by 60 degrees toward the sides thereof with respect to the front thereof. The values Δx and Δy indicate variations of color coordinate values of light emitted toward the front of the organic light-emitting display apparatus 100 and color coordinate values of light emitted and inclined by 60 degrees toward the y and x axes with respect to the front thereof.

TABLE 1

| W | Brightness ratio | Δx | Δy |
|---|---|---|---|
| Haze 0% | 33.2% | −0.0581 | 0.02669 |
| Haze 40% | 34.2% | −0.0546 | 0.01885 |
| Haze 80% | 36.0% | −0.04648 | 0.0109 |

TABLE 2

| R | Brightness ratio | Δx | Δy |
|---|---|---|---|
| Haze 0% | 24.6% | −0.03115 | 0.03056 |
| Haze 40% | 26.4% | −0.03084 | 0.0302 |
| Haze 80% | 29.6% | −0.02815 | 0.02736 |

TABLE 3

| G | Brightness ratio | Δx | Δy |
|---|---|---|---|
| Haze 0% | 37.2% | −0.07791 | −0.04159 |
| Haze 40% | 38.0% | −0.07429 | −0.03975 |
| Haze 80% | 39.0% | −0.06434 | −0.03931 |

TABLE 4

| B | Brightness ratio | Δx | Δy |
|---|---|---|---|
| Haze 0% | 25.2% | 0.00688 | −0.009 |
| Haze 40% | 26.6% | 0.00746 | −0.00982 |
| Haze 80% | 29.3% | 0.00734 | −0.00914 |

Referring to Tables 1 to 4 above, regarding the white W, the brightness ratios increases in Haze 80% compared to Haze 0%, and the variations of color coordinates values of light emitted toward the sides of the organic light-emitting display apparatus 100 with respect to the front thereof, i.e. the color shift, are reduced.

More specifically, as the amount of the first materials 161 included in the second material 162 increases, the brightness of the organic light-emitting display apparatus 100 increases, and the color shift is reduced in the sides thereof.

FIGS. 3 through 6 are cross-sectional views sequentially illustrating a method of manufacturing the organic light-emitting display apparatus of FIG. 1 according to an embodiment of the present invention.

Figure 3:
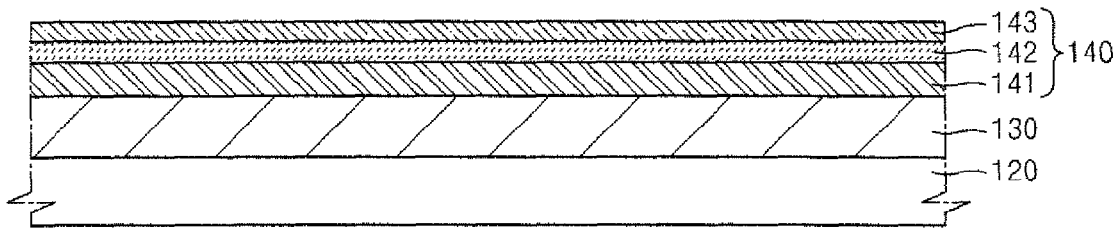
FIGS. 3 through 6 are cross-sectional views sequentially illustrating a method of manufacturing the organic light-emitting display apparatus of FIG. 1 according to an embodiment of the present invention.

Referring to FIG. 3, the device/wiring layer 130 and the OLED 140, including the pixel electrode 141, the organic light-emitting layer 142, and the opposing electrode 143, are formed on the substrate 120.

The substrate 120 may be a flexible substrate which may be disposed on a support substrate (not shown) formed of glass supporting the flexible substrate. The support substrate (not shown) may be removed after all processes are complete or during the processes.

As described above, the substrate 120 may be formed of plastic having excellent heat resistance and durability.

A barrier film (not shown) may be further disposed on the substrate 120. The barrier film (not shown) may include inorganic films and/or organic films, and blocks external impurities from transmitting through the substrate 120 and penetrating into the device/wiring layer 130 and the OLED 140.

The device/wiring layer 130 may include the driving TFT (see FIG. 2), a capacitor (not shown), and wirings (not shown) for driving the OLED 140.

The pixel electrode 141, the organic light-emitting layer 142, and the opposing electrode 143 are sequentially formed on the device/wiring layer 130.

The pixel electrode 141 may be a reflective electrode. The opposing electrode 143 may be a transparent or a semi-transparent electrode. Thus, light generated in the organic light-emitting layer 142 may be emitted toward the opposing electrode 143 directly or after being reflected from the pixel electrode 141.

In this regard, a resonance structure may be formed by the opposing electrode 143 formed as the semi-transparent electrode and the pixel electrode 141.

The organic light-emitting layer 142 may be a low molecular weight organic material or a high molecular weight organic material. An intermediate layer, as described above, may be disposed between the pixel electrode 141 and the opposing electrode 143, in addition to the organic light-emitting layer 142.

Although the OLED 140 is formed on the device/wiring layer 130 in the present embodiment, the present invention is not limited thereto. The device/wiring layer 130 and the OLED 140 may be formed in the same layer.

Figure 4:
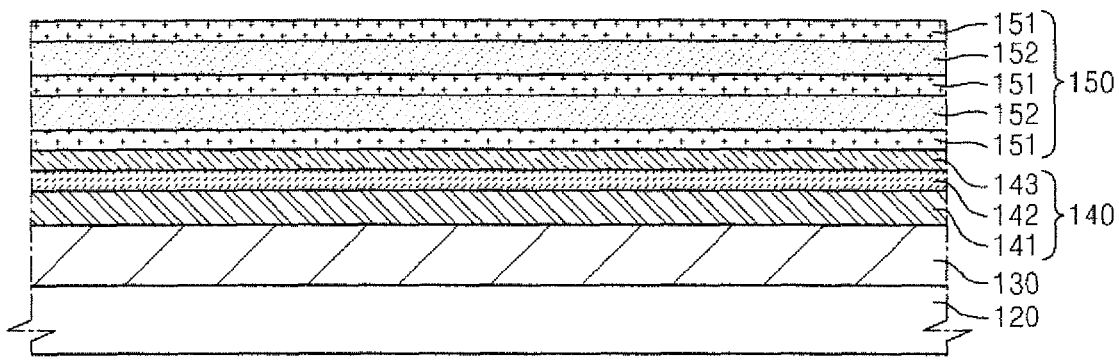

Referring to FIG. 4, the inorganic films 151 and the organic films 152 are alternately formed on the OLED 140, and thus the first transmission layer 150 including a plurality of layers is formed.

Although the inorganic films 151 are formed in the lowest layer and the highest layer of the first transmission layer 150 contacting the opposing electrode 143, and are three-layer films, and the organic films 152 are two-layer films in the present embodiment, the present invention is not limited thereto. The sequence of formation of the inorganic films 151 and the organic films 152, or the number of how many times the inorganic films 151 and the organic films 152 are alternately formed, is not limited to the present embodiment.

Figure 5:
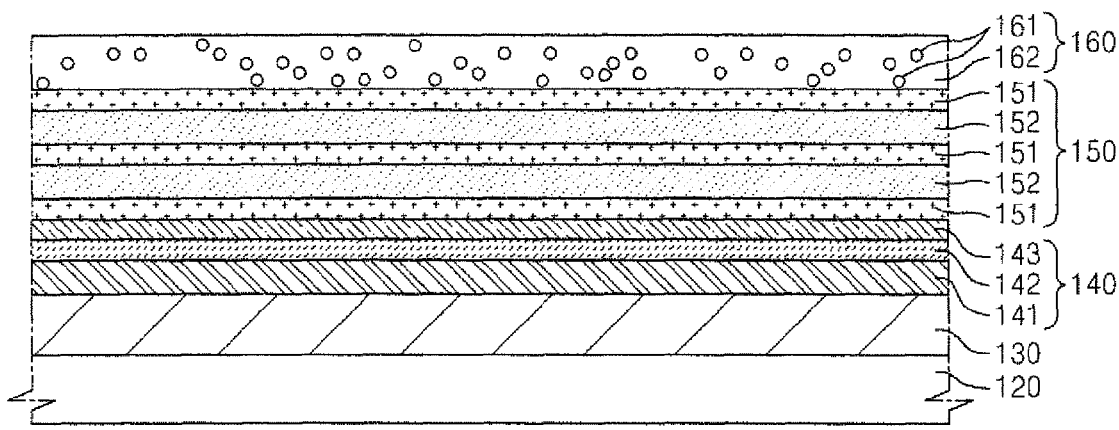

Referring to FIG. 5, the second transmission layer 160, including the first materials 161 and the second material 162, is formed on the first transmission layer 150.

The first materials 161 included in the second transmission layer 160 have first refractive indices. The second material 162 has a second refractive index. The first refractive indices are greater than the second refractive index. In this regard, the first refractive indices may be 1.5 or more and may also be 2.0 or more.

The plurality of first materials 161 are disposed in the second material 162, and may be spherical. The first materials 161 may include zirconium (Zr) or silicon (Si), and may have diameters between 0.1 µm and 5 µm.

The second material 162 may include a viscous material. The viscous material may be a transparent polymer material.

Figure 6:
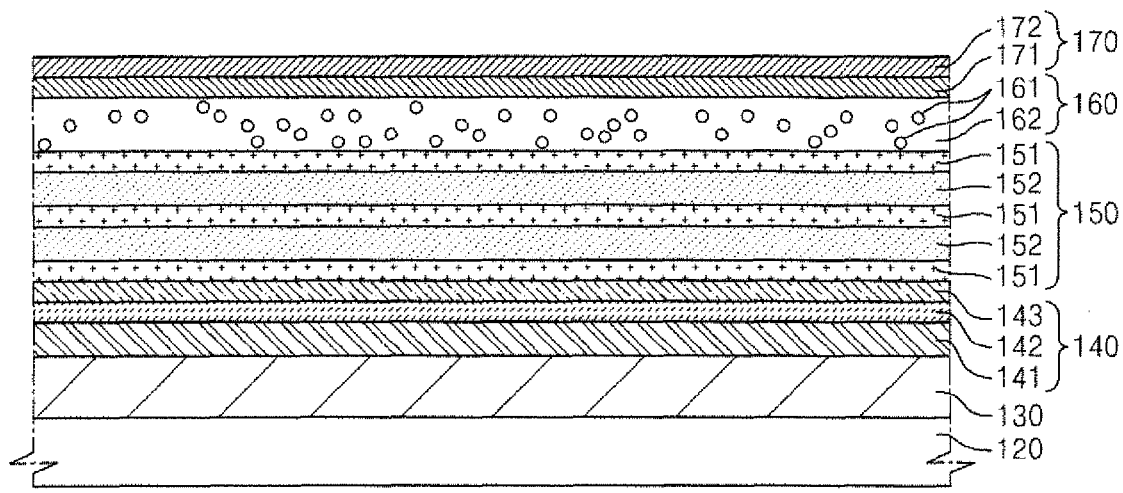

Referring to FIG. 6, the optical member 170 is formed by sequentially forming the delay plate 171 and the polarizing plate 172 on the second transmission layer 160.

In this regard, the optical member 170 may inhibit reflection of external light, and may enhance visibility and contrast of the organic light-emitting display apparatus 100.

Figure 7:
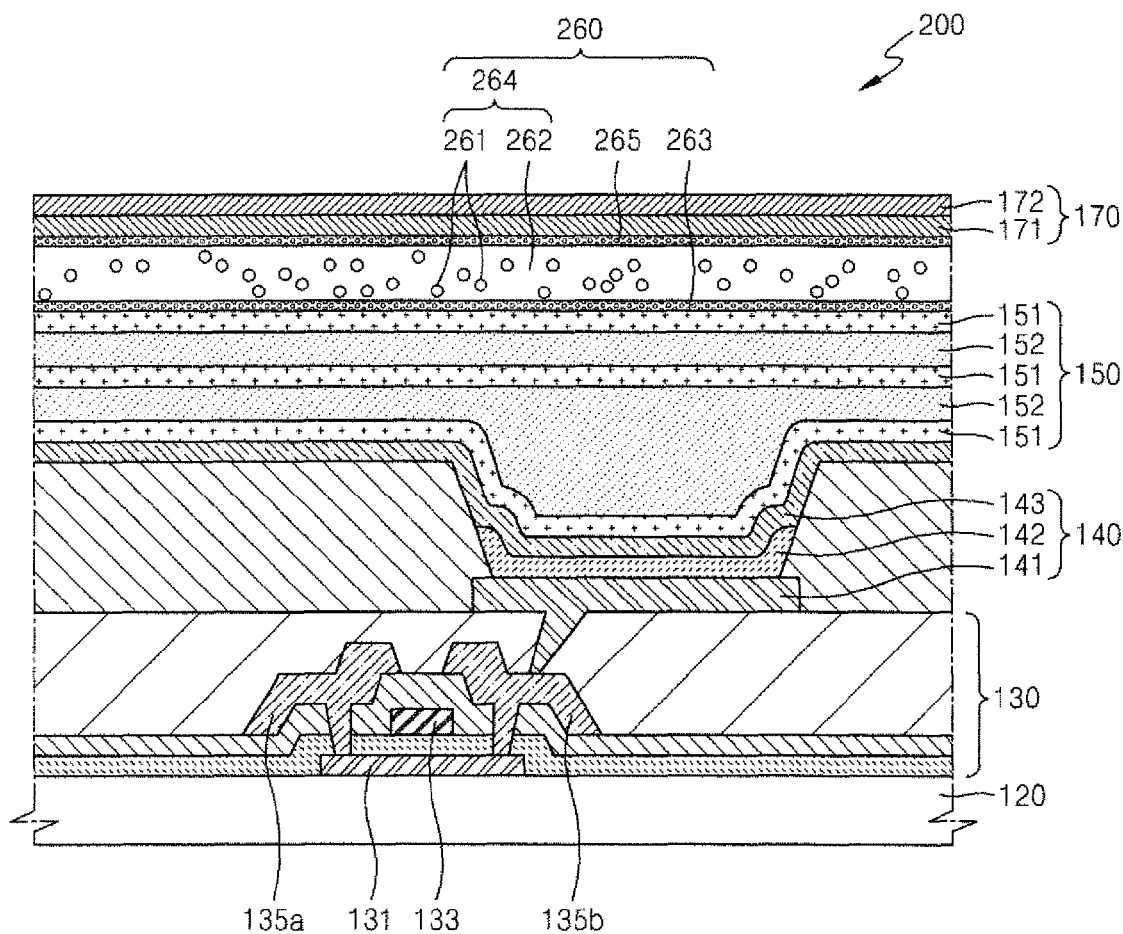
FIG. 7 is a schematic cross-sectional view of an organic light-emitting display apparatus according to another embodiment of the present invention.

FIG. 7 is a schematic cross-sectional view of an organic light-emitting display apparatus according to another embodiment of the present invention.

The organic light-emitting display apparatus 200 of the present embodiment, that is different from the organic light-emitting display apparatus 100 of FIGS. 1 and 2, will now be described.

Referring to FIG. 7, the organic light-emitting display apparatus 200 is the same as the organic light-emitting display apparatus 100, except for the construction of a second transmission layer 260.

The second transmission layer 260 includes a first layer 263 contacting the first transmission layer 150 and including a viscous material, a second layer 264 disposed on the first layer 263 and including a plurality of first materials 261 and a second material 262, and a third layer 265 disposed on the second layer 264 and including the viscous material.

The first materials 261 included in the second material 264 may include zirconium (Zr) or silicon (Si), and may have diameters between 0.1 µm and 5 µm. The second material 262 may be a transparent organic material. In this regard, refractive indices of the first materials 261 may be greater than that of the second material 262.

The first layer 263 is disposed between the first transmission layer 150 and the second layer 264, and includes the viscous material. The first layer 263 serves to bond the first transmission layer 150 and the second layer 264, and may be a transparent polymer material.

The third layer 265 is disposed between the second layer 264 and the optical member 170, and includes the viscous material. The third layer 265 serves to bond the second layer 264 and the optical member 170, and may be a transparent polymer material. In this regard, the first layer 263 and the third layer 265 may be formed of the same material or different materials.

The other elements of the organic light-emitting display apparatus 200 are the same as the organic light-emitting display apparatus 100, and thus descriptions thereof will be omitted.

Figure 8:
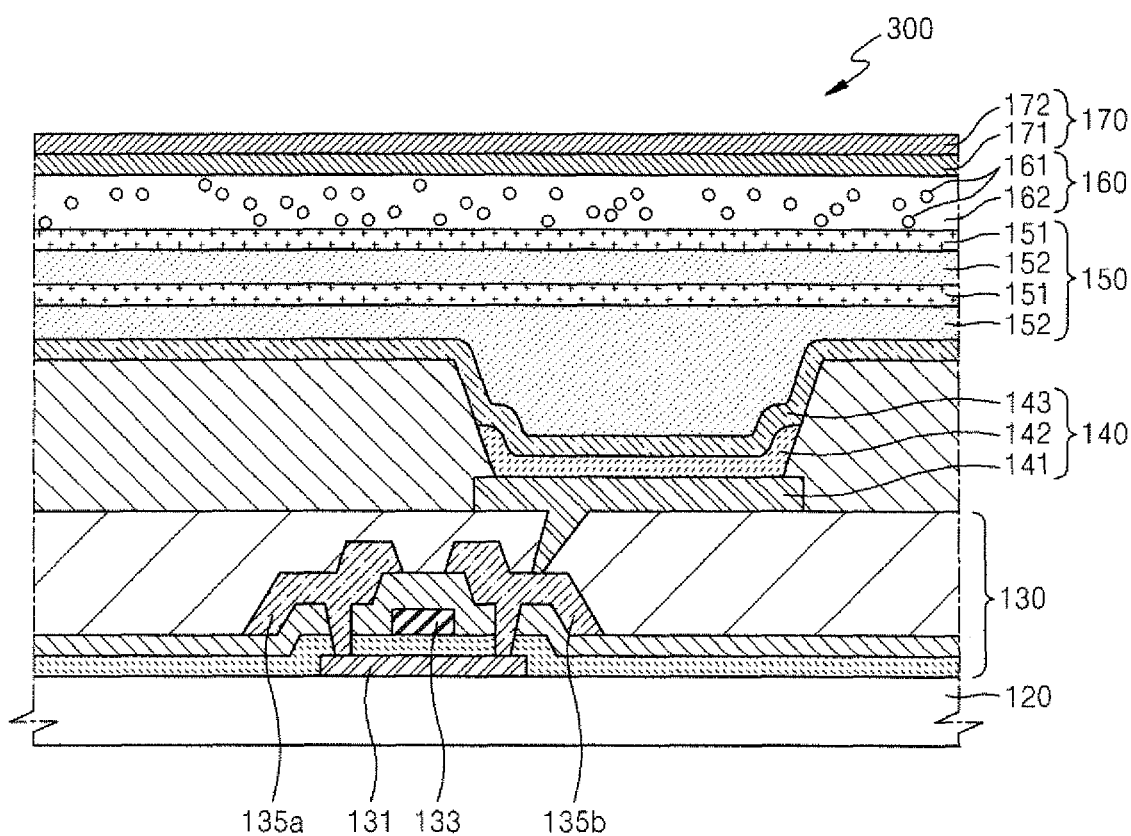
FIG. 8 is a schematic cross-sectional view of an organic light-emitting display apparatus according to another embodiment of the present invention.

FIG. 8 is a schematic cross-sectional view of an organic light-emitting display apparatus according to another embodiment of the present invention.

Referring to FIG. 8, the organic light-emitting display apparatus 300 is the same as the organic light-emitting display apparatus 100 of FIGS. 1 and 2, except that the organic films 152 are disposed in the lowest layer of the first transmission layer 150 contacting the OLED 140.

The OLED 140 includes a plurality of thin films, and thus a surface thereof may not be planar. In this case, the light characteristics deteriorate, and an adhesive force between the OLED 140 and the first transmission layer 150 may be reduced.

In the present embodiment, the organic films 152 are disposed in the lowest layer of the first transmission layer 150 contacting the OLED 140, thereby planarizing the surface of the OLED 140, and increasing the adhesive force between the OLED 140 and the first transmission layer 150.

The other elements of the organic light-emitting display apparatus 300 are the same as the organic light-emitting display apparatus 100, and thus descriptions thereof will be omitted.

Although the OLED 140 and the first transmission layer 150 are configured to directly contact each other in the organic light-emitting display apparatuses 100, 200, and 300 of the embodiments of the present invention, the present invention is not limited thereto. Layers may be disposed between the OLED 140 and the first transmission layer 150.

That is, a protection layer (not shown), such as an ultraviolet ray blocking layer (not shown), or a capping layer (not shown), for protecting the OLED 140 may be disposed between the OLED 140 and the first transmission layer 150.

Figure 9:
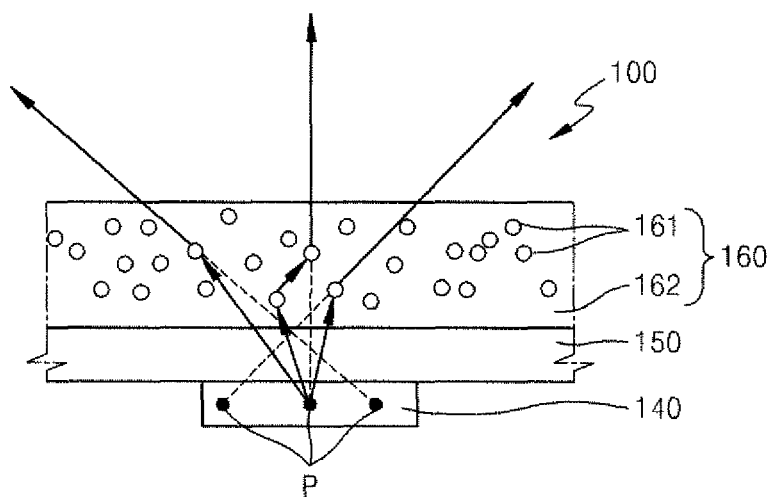
FIG. 9 is a schematically conceptual diagram of a path of light emitted from the organic light-emitting display apparatus of FIG. 1.
Figure 10:
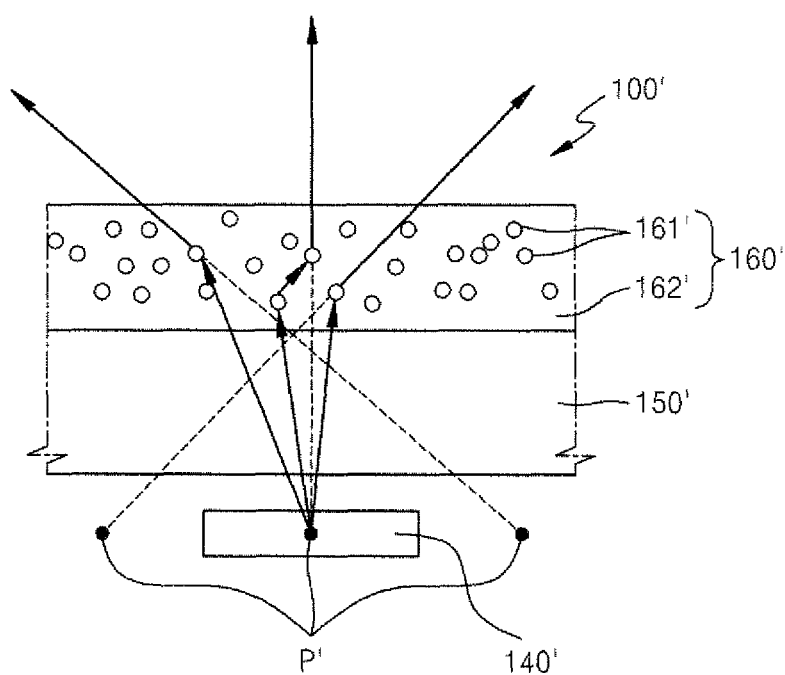
FIG. 10 is a schematically conceptual diagram of a path of light emitted from an organic light-emitting display apparatus according to a comparison example.

FIG. 9 is a schematically conceptual diagram of a path of light emitted from the organic light-emitting display apparatus of FIG. 1. FIG. 10 is a schematically conceptual diagram of a path of light emitted from an organic light-emitting display apparatus according to a comparison example.

In FIGS. 9 and 10, refraction of light due to a difference in a refractive index between neighboring lights is omitted for descriptive convenience. Also, unbroken lines indicate paths of light emitted from the OLED 140 and an OLED 140', and dotted lines indicate tracks of viewing angles of light emitted to the outside.

In the organic light-emitting display apparatus 100' of FIG. 10, an encapsulation layer 150' having a greater thickness than the first transmission layer 150 including a plurality of thin films of FIG. 9 is disposed between the OLED 140' and a second transmission layer 160'. In this regard, the encapsulation layer 150' may be a glass substrate.

The encapsulation layer 150' is much thicker than the first transmission layer 150 including the thin films of FIG. 9, and does not generally contact the OLED 140'. Thus, the distance between the OLED 140' and the second transmission layer 160' disposed on the encapsulation layer 150' has a value much greater than that of the distance between the OLED 140 and the second transmission layer 160 of FIG. 9.

Therefore, since the path of the light emitted from the OLED 140' toward the second transmission layer 160' increases, a direction of light traveling in the second transmission layer 160' changes, and thus a position P' in which the light emitted to the outside is formed is not within an area in which the OLED 140' is disposed, i.e. a pixel area. That is, when observed from the outside, a screen of the organic light-emitting display apparatus 100' looks blurry, which deteriorates quality of an image.

However, since the first transmission layer 150 of the organic light-emitting display apparatus 100 of FIG. 9 includes the thin films, the first transmission layer 150 has a small thickness, and thus the distance between the OLED 140 and the second transmission layer 160 is much smaller than that of FIG. 10.

Thus, although the direction of the light emitted from the OLED 140 changes due to the second transmission layer 160, the position P in which the light emitted to the outside is formed is within an area in which the OLED 140 is disposed, i.e. a pixel area.

Thus, the distance between the OLED 140 and the second transmission layer 160 of the organic light-emitting display apparatus 100 of the present invention may be limited below a predetermined value in order to prevent a screen from being blurry. The distance may be 50 µm or less.

According to the organic light-emitting display apparatus and the method of manufacturing the organic light-emitting display apparatus of the embodiments of the present invention, a second transmission layer is disposed on a first transmission layer, thereby reducing a color shift that occurs at lateral viewing angles.

Also, the efficiency of extracted light can be increased.

In addition, the quality of an image implemented by the organic light-emitting display apparatus can be enhanced.

Although the thicknesses or size of layers are exaggerated or reduced for clarity in the drawings, the present invention is not limited to sizes or shapes of the elements illustrated in the drawings.

While the present invention has particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display apparatus, comprising:
    a substrate;
    a pixel electrode disposed on the substrate;
    an opposing electrode disposed on the pixel electrode and transmitting light therethrough;
    an organic light-emitting layer disposed between the pixel electrode and the opposing electrode and emitting light toward at least the opposing electrode;
    a first transmission layer disposed on the opposing electrode and transmitting the light emitted from the organic light-emitting layer therethrough; and
    a second transmission layer disposed on a path of the light emitted from the organic light-emitting layer on the first transmission layer, and comprising a plurality of first materials having first refractive indices and a second organic material having a second refractive index, the first refractive indices are greater than the second refractive index, and the plurality of first materials are disposed inside the second organic material;
    the second transmission layer further comprising:
        a first organic layer contacting the first transmission layer and comprising a viscous material,
        a second layer disposed on the first organic layer and comprising the plurality of first materials and the second organic material, and
        a third organic layer disposed on the second layer and comprising a viscous material,
    a range of distance between the organic light-emitting layer and the second transmission layer is greater than 0.23 µm and not greater than 50 µm.

2. The organic light-emitting display apparatus of claim 1, further comprising an optical member disposed on the second transmission layer.

3. The organic light-emitting display apparatus of claim 1, comprising: a protection layer disposed between the opposing electrode and the first transmission layer.

4. The organic light-emitting display apparatus of claim 1, the minimum value of the first refractive indices of the plurality of first materials is 1.5.

5. The organic light-emitting display apparatus of claim 1, the plurality of first materials having sizes between 0.1 µm and 5 µm.

6. The organic light-emitting display apparatus of claim 1, the plurality of first materials comprise one of zirconium (Zr) and silicon (Si).

7. The organic light-emitting display apparatus of claim 1, the substrate being flexible.

8. The organic light-emitting display apparatus of claim 1, the first transmission layer comprises a plurality of layers in which inorganic films and organic films are alternately disposed.

9. An organic light-emitting display apparatus, comprising:
    a substrate;
    a pixel electrode disposed on the substrate;
    an opposing electrode disposed on the pixel electrode and transmitting light therethrough;
    an organic light-emitting layer disposed between the pixel electrode and the opposing electrode and emitting light toward at least the opposing electrode;
    a first transmission layer comprising a thin film including inorganic and organic films disposed on the opposing electrode and transmitting the light emitted from the organic light-emitting layer and endowing said organic light-emitting display apparatus with flexibility; and
    a second transmission layer disposed on a path of the light emitted from the organic light-emitting layer on the first transmission layer, and comprising a plurality of first materials having first refractive indices and a second organic material having a second refractive index, the first refractive indices are greater than the second refractive index, and the plurality of first materials are disposed inside the second organic material,
    a range of distance between the organic light-emitting layer and the second transmission layer is greater than 0.23 µm and not greater than 50 µm.

10. An organic light-emitting display apparatus, comprising:
    a substrate;
    a pixel electrode disposed on the substrate;
    an opposing electrode disposed on the pixel electrode and transmitting light therethrough;
    an organic light-emitting layer disposed between the pixel electrode and the opposing electrode and emitting light toward at least the opposing electrode;
    a first transmission layer comprised of a thin film including inorganic and organic films including a first film planarizing a surface of the opposing electrode and a second film obstructing passage of moisture and oxygen disposed on the opposing electrode and transmitting the light emitted from the organic light-emitting layer, comprising a plurality of layers in which inorganic films and organic films are alternately disposed; and
    a second transmission layer disposed on a path of the light emitted from the organic light-emitting layer on the first transmission layer, and comprising a plurality of first materials having first refractive indices and a second organic material having a second refractive index, the first refractive indices are greater than the second refractive index, and the plurality of first materials are disposed inside the second organic material,
    a range of distance between the organic light-emitting layer and the second transmission layer is greater than 0.23 µm and not greater than 50 µm.

* * * * *